US012429421B2

United States Patent
Xiao et al.

(10) Patent No.: US 12,429,421 B2
(45) Date of Patent: Sep. 30, 2025

(54) TERAHERTZ RADIATION DETECTORS BASED ON THIN FILMS OF NON-CENTROSYMMETRIC LAYERED TOPOLOGICAL SEMIMETALS

(71) Applicant: Wisconsin Alumni Research Foundation, Madison, WI (US)

(72) Inventors: Jun Xiao, Madison, WI (US); Ying Wang, Madison, WI (US); Daniel Warren van der Weide, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 273 days.

(21) Appl. No.: 18/448,648

(22) Filed: Aug. 11, 2023

(65) Prior Publication Data

US 2025/0052676 A1 Feb. 13, 2025

(51) Int. Cl.
G01N 21/3581 (2014.01)
H10F 30/10 (2025.01)

(52) U.S. Cl.
CPC ......... *G01N 21/3581* (2013.01); *H10F 30/10* (2025.01)

(58) Field of Classification Search
CPC .............................. H10F 30/00; G01N 21/3581
See application file for complete search history.

(56) References Cited

U.S. PATENT DOCUMENTS 11,355,697 B2 6/2022 Xiao

FOREIGN PATENT DOCUMENTS

CN 116169189 A * 5/2023 ............. H10F 71/00
CN 119365059 A * 1/2025 ............. H10N 52/01

OTHER PUBLICATIONS

Vicarelli et al., "Graphene Field-Effect Transistors As Room-Temperature Terahertz Detectors," Nature Materials, vol. 11, Oct. 2012. (Year: 2012).*
Zhang et al., "Terahertz Detection Based On Nonlinear Hall Effect Without Magnetic Field," arXiv:2101.05842v1, Jan. 14, 2021. (Year: 2021).*
Xiao, Jun, Ying Wang, Hua Wang, C. D. Pemmaraju, Siqi Wang, Philipp Muscher, Edbert J. Sie et al. "Berry curvature memory through electrically driven stacking transitions." Nature Physics 16, No. 10 (2020): 1028-1034.
Du, Z. Z., C. M. Wang, Shuai Li, Hai-Zhou Lu, and X. C. Xie. "Disorder-induced nonlinear Hall effect with time-reversal symmetry." Nature Communications 10, No. 1 (2019): 3047.
Wang, Cong, Rui-Chun Xiao, Huiying Liu, Zhaowei Zhang, Shen Lai, Chao Zhu, Hongbing Cai et al. "Room-temperature third-order nonlinear Hall effect in Weyl semimetal TaIrTe4." National Science Review 9, No. 12 (2022): nwac020.

(Continued)

*Primary Examiner* — Casey Bryant
(74) *Attorney, Agent, or Firm* — Bell & Manning, LLC

(57) ABSTRACT

Terahertz (THz) radiation detectors based on the rectification of a THz signal via the non-linear Hall effect in thin films of non-centrosymmetric layered topological semimetals are provided. The THz detectors, which enable sensitive, broadband, and fast room-temperature terahertz radiation detection, can be fabricated with electrostatic gates to tune the terahertz rectification.

20 Claims, 13 Drawing Sheets

(56) References Cited

OTHER PUBLICATIONS

Kumar, Nitesh, Satya N. Guin, Kaustuv Manna, Chandra Shekhar, and Claudia Felser. "Topological quantum materials from the viewpoint of chemistry." Chemical Reviews 121, No. 5 (2020): 2780-2815.

Ma, Qiong, et al. "Observation of the nonlinear Hall effect under time-reversal-symmetric conditions." Researchgate, Preprint, Sep. 2018.

Isobe, Hiroki, Su-Yang Xu, and Liang Fu. "High-frequency rectification via chiral Bloch electrons." Science advances 6, No. 13 (2020): eaay2497.

Toshio, Riki, and Norio Kawakami. "Plasmonic quantum nonlinear Hall effect in noncentrosymmetric two-dimensional materials." Physical Review B 106, No. 20 (2022): L201301.

Hu, Zhen, Libo Zhang, Atasi Chakraborty, Gianluca D'Olimpio, Jun Fujii, Anping Ge, Yuanchen Zhou et al. "Terahertz Nonlinear Hall Rectifiers Based on Spin-Polarized Topological Electronic States in 1T-CoTe2." Advanced Materials 35, No. 10 (2023): 2209557.

Min, Lujin, Hengxin Tan, Zhijian Xie, Leixin Miao, Ruoxi Zhang, Seng Huat Lee, Venkatraman Gopalan et al. "Strong room-temperature bulk nonlinear Hall effect in a spin-valley locked Dirac material." Nature communications 14, No. 1 (2023): 364.

Zhang, Yang, and Liang Fu. "Terahertz detection based on nonlinear Hall effect without magnetic field." Jan. 14, 2021.

Zhang, Yang, and Liang Fu. Supplemental Information. "Terahertz detection based on nonlinear Hall effect without magnetic field." Jan. 14, 2021.

Du, Z. Z., Hai-Zhou Lu, and X. C. Xie. "Perspective: Nonlinear hall effects." arXiv e-prints (2021): arXiv-2105.

Kumar, Dushyant, Chuang-Han Hsu, Raghav Sharma, Tay-Rong Chang, Peng Yu, Junyong Wang, Goki Eda, Gengchiau Liang, and Hyunsoo Yang. "Room-temperature nonlinear Hall effect and wireless radiofrequency rectification in Weyl semimetal TaIrTe4." Nature Nanotechnology 16, No. 4 (2021): 421-425.

Ma, Junchao, Ke Deng, Lu Zheng, Sanfeng Wu, Zheng Liu, Shuyun Zhou, and Dong Sun. "Experimental progress on layered topological semimetals." 2D Materials 6, No. 3 (2019): 032001.

* cited by examiner

FIG. 1A
FIG. 1B
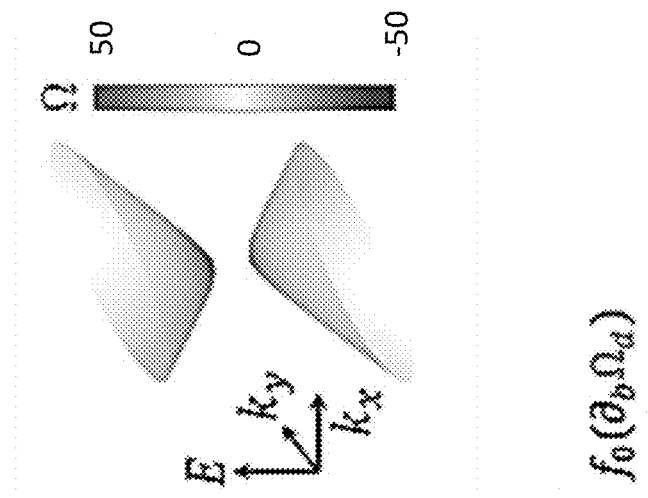
Diverging Berry curvature
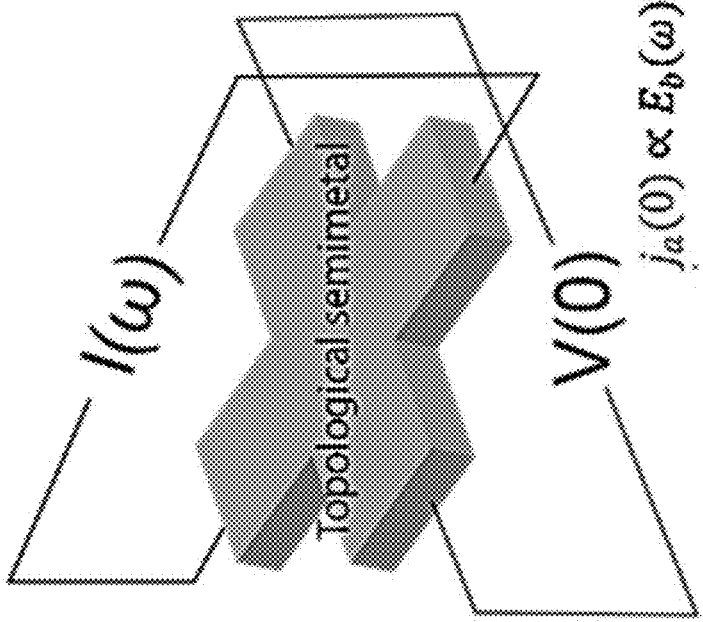
Nonlinear Hall Effect

```
┌─────────────────────────────────────────────────────────────┐
│                                                        350  │
│        Form Graphite/h-BN Top Layer on TaIrTe₄ Layer        │
│  ┌───────────────────────────────────────────────────┐      │
│  │                                              352  │      │
│  │   Exfoliate nm-thick Graphite and h-BN Flakes on Substrate │
│  └───────────────────────────────────────────────────┘      │
│                                                             │
│  ┌───────────────────────────────────────────────────┐      │
│  │                                              354  │      │
│  │      Deposit Graphite and h-BN Crystals by Polymer Stamp │
│  └───────────────────────────────────────────────────┘      │
│                                                             │
│  ┌───────────────────────────────────────────────────┐      │
│  │                                              356  │      │
│  │                 Dissolve Polymer Stamp             │      │
│  └───────────────────────────────────────────────────┘      │
└─────────────────────────────────────────────────────────────┘
```

Form Graphite/h-BN Top Layer on TaIrTe₄ Layer — 350

Exfoliate nm-thick Graphite and h-BN Flakes on Substrate — 352

Deposit Graphite and h-BN Crystals by Polymer Stamp — 354

Dissolve Polymer Stamp — 356

Form Metallic Bonding Pads on Graphite and Pt Layers — 360

FIG. 3B

Table 1. Operating regime of known THz detectors compared with the projected operating characteristics for the present THz NHDs based on layered topological semimetals.

| | Responsivity (V/W) $10^2 \quad 10^4 \quad 10^6$ | Noise Equivalent power (W Hz$^{1/2}$) $10^{-14} \quad 10^{-12} \quad 10^{-10}$ | Spectral bandwidth (THz) $0.1 \quad 1 \quad 10$ | Response time $ns \quad \mu s \quad ms$ |
|---|---|---|---|---|
| Present NHDs | | | | |
| Bolometer/Golay | | | | |
| HEMT | | | | |
| Schottky diode | | | | |

FIG. 5

TERAHERTZ RADIATION DETECTORS BASED ON THIN FILMS OF NON-CENTROSYMMETRIC LAYERED TOPOLOGICAL SEMIMETALS

BACKGROUND

Terahertz (THz) technology is critical in quantum information technology and biomedical sensing because its frequency (0.1-10 THz) resonates with low-energy information carriers (e.g., coherent phonons and magnons) in quantum materials and molecular vibrations in biological matter (e.g., skin tumor tissues and blood cells). Moreover, the ultrahigh-bandwidth of the THz band can enable high-speed wireless communication, which is crucial for many naval applications including networking among maritime, terrestrial, and aerial platforms on the battlefield.

However, the feasibility of THz technologies, including high-speed communication, has been curtailed by the problem of high path loss. Theoretically, this hurdle could be overcome if THz receivers were sufficiently efficient to capture weak and rapidly modulated THz signals, even in their significantly decayed state. Unfortunately, state-of-the-art THz detectors lack the ability to provide sensitive, broadband, and fast THz detection simultaneously. THz detectors can be classified into three categories: thermal detectors that use heating effects induced by THz irradiance (e.g., bolometers and Golay cells), photonic detectors based on interband transitions (e.g., narrow band gap quantum wells), and electronic detectors that utilize THz electric field-driven electron/plasmon flow across junction barriers unidirectionally (e.g., Schottky diodes and high electron mobility transistors (HEMTs)). Thermal-type THz photodetectors are bulky and slow due to thermal heating and transport. Photonic detectors rely on the absorption of THz photons across their ultranarrow bandgap. Cryogenic cooling is needed to suppress biased dark current from thermal fluctuation, and the detection is only sensitive to narrowband THz frequencies determined by their band structures. And, while electronic detectors can detect sub-ns signal modulation at room temperature, their responsivity decreases rapidly with frequency and narrow wavelength bandwidth due to intrinsic capacitance and resonant tunnelling at metal-insulator interfaces.

SUMMARY

High-performance THz photodetectors that leverage the giant non-linear Hall effect and large gating tunability in layered topological semimetals are provided. Also provided are methods for using the THz photodetectors to detect incident THz radiation.

One embodiment of a terahertz radiation detector includes: a film of layered topological semimetal having non-centrosymmetric crystal symmetry; a first electrically conductive terminal in contact with the film of layered topological semimetal; a second electrically conductive terminal in contact with the film of layered topological semimetal; at least one gate on a bottom surface or on a top surface of the layered topological semimetal, the at least one gate comprising a gate dielectric in contact with the layered topological semimetal and a gate electrode on the gate dielectric; a voltage source connected to the gate and configured to apply a gate voltage to the film of layered topological semimetal; and a current detector connected to the first and second electrically conductive terminals and configured to measure a transverse direct current through the film of layered topological semimetal One embodiment of a method for detecting THz radiation using a terahertz radiation detector of a type described herein includes the steps of: exposing the film of topological semimetal to terahertz radiation, whereby the terahertz radiation produces a transverse direct current in the film of topological semimetal via the non-linear Hall effect; and measuring the transverse direct current using the current detector.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIGS. 1A and 1B. Gate tunable THz non-linear Hall detector. FIG. 1A. Non-linear Hall effect in layered topological semimetals, converting alternating longitudinal current $I(\omega)$ to transverse direct current $J(0)$ and Hall voltage $V(0)$. FIG. 1B. Diverging Berry curvature $\Omega$ in momentum space.

FIGS. 3A and 3B. Flow chart of an illustrative fabrication scheme for a THz non-linear Hall detector through the formation of the layered topological semimetal layer (FIG. 3A) and then through the formation of electrically conducting bonding pads (FIG. 3B).

FIG. 5. Chart of illustrative responsivity, noise equivalent power, spectral bandwidth, and response time operating ranges for a THz non-linear Hall detector.

DETAILED DESCRIPTION

THz radiation detectors based on the rectification of a THz signal via the non-linear Hall effect in thin films of non-centrosymmetric layered topological semimetals are provided. The detectors are referred to as THz non-linear Hall detectors ("THz NHDs"). The THz NHDs enable sensitive, broadband, and fast room-temperature THz detection. Moreover, the THz NHDs can be fabricated with electrostatic gates for gate tunability to achieve a broad spectral bandwidth range and fast response speeds at wavelengths that are useful for quantum science, biosensing, and telecommunications.

The THz rectification mechanism in the THz NHDs is mediated by a diverging quantum geometric property of the layered topological semimetals that leads to a non-linear Hall effect. As illustrated in FIG. 1A, the non-linear Hall effect induces a large transverse direct current J(0) and Hall voltage V(0) in response to a longitudinal alternating driving current I(ω). This diverging quantum property, also referred to as Berry curvature (FIG. 1B), is a geometrical property of an electron's wavefunction that works similarly to an effective magnetic and electric field to unidirectionally accelerate electrons when an external electromagnetic (EM) wave is present. The underlying mechanism for this is related to the asymmetric distribution of Berry curvature in momentum space. When an electric field is applied to a layered topological semimetal, electrons in the material redistribute in momentum space, leading to an imbalance in the Berry curvature experienced by the electrons. This Berry curvature imbalance endows electrons with unidirectional anomalous transverse velocities proportional to the product of the E-field induced Berry curvature imbalance and applied electric field, thus leading to a DC rectification current.

The use of diverging Berry curvature and non-linear Hall effects in the layered topological semimetals of the THz NHDs enables the fabrication of detectors with large responsivities with zero bias at room temperature, high cutoff frequencies of up to tens of THz, short response times— down to picoseconds (ps), and a simple and compact device architecture without the need for junction fabrication. In addition, the large THz responsivity of the detectors reduces, and can even eliminate, the need for an external electrical power supply. Therefore, harnessing the Berry curvature for THz rectification provides an efficient approach to the fabrication of energy-efficient THz detectors for sustainable energy production, sensitive detection, and fast communication.

THz NHD Design.

Figure 1C:
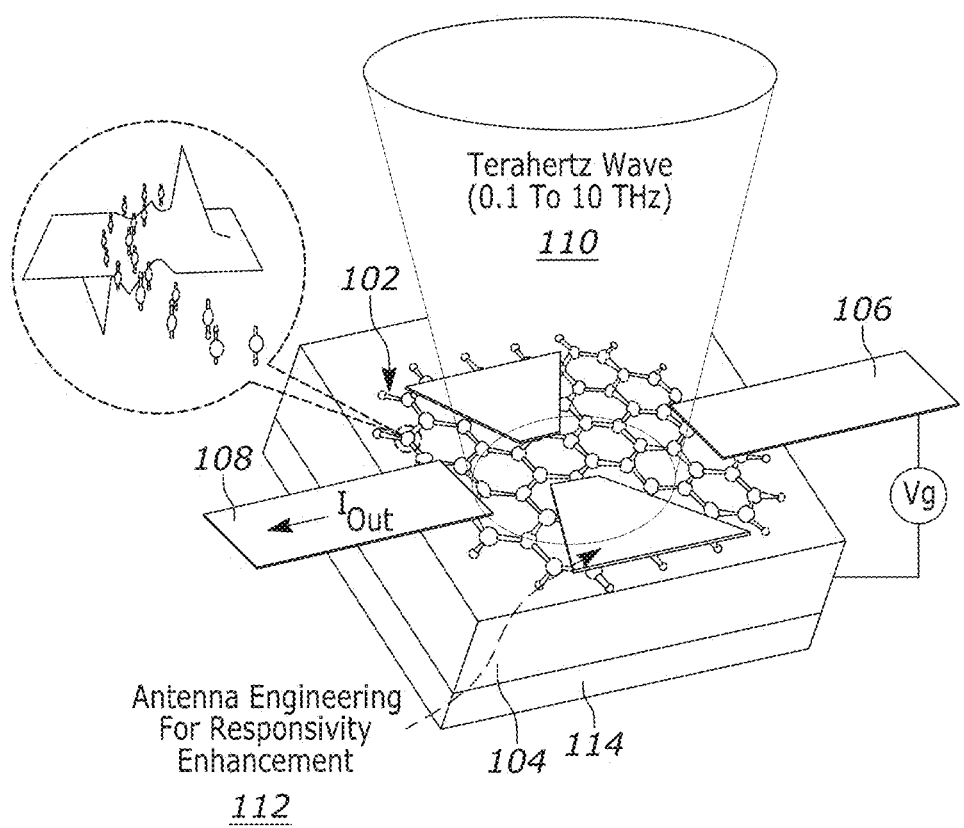
FIG. 1C. Schematic diagram of a THz non-linear Hall detector with a single bottom gate. The inset in a dashed line to the left of the figure shows a Giant Berry Curvature in a compact two-dimensional topological semimetal detector.

One embodiment of a THz NHD is shown schematically in FIG. 1C. The detector has a planar Hall device geometry and includes a thin layer of a layered topological semimetal 102 on a dielectric material 104. Layered topological semimetal 102 forms a pathway for a transverse direct current between two electrically conductive terminals 106, 108. When a THz signal 110 is incident upon layered topological semimetal 102, the resulting transverse direct current through layered topological semimetal 102 can be measured using a current detector connected across electrically conductive contacts 106, 108. Optionally, electrodes for an antenna 112 may be formed on layered topological semimetal 102 to amplify THz signal 110. In the embodiment of FIG. 1C, a bowtie-type antenna is depicted. However, other antenna geometries can also be used.

The upper surface area of the film of layered topological semimetal 102 provides the detection area of the THz NHD and is desirably sufficiently large to provide an adequate detection surface area for a given application, but small enough to provide a fast response time and compact detector design. Therefore, the detection area of the film of layered topological semimetal is typically 50 $\mu m^2$ or smaller. However, larger films can be used.

Figure 2:
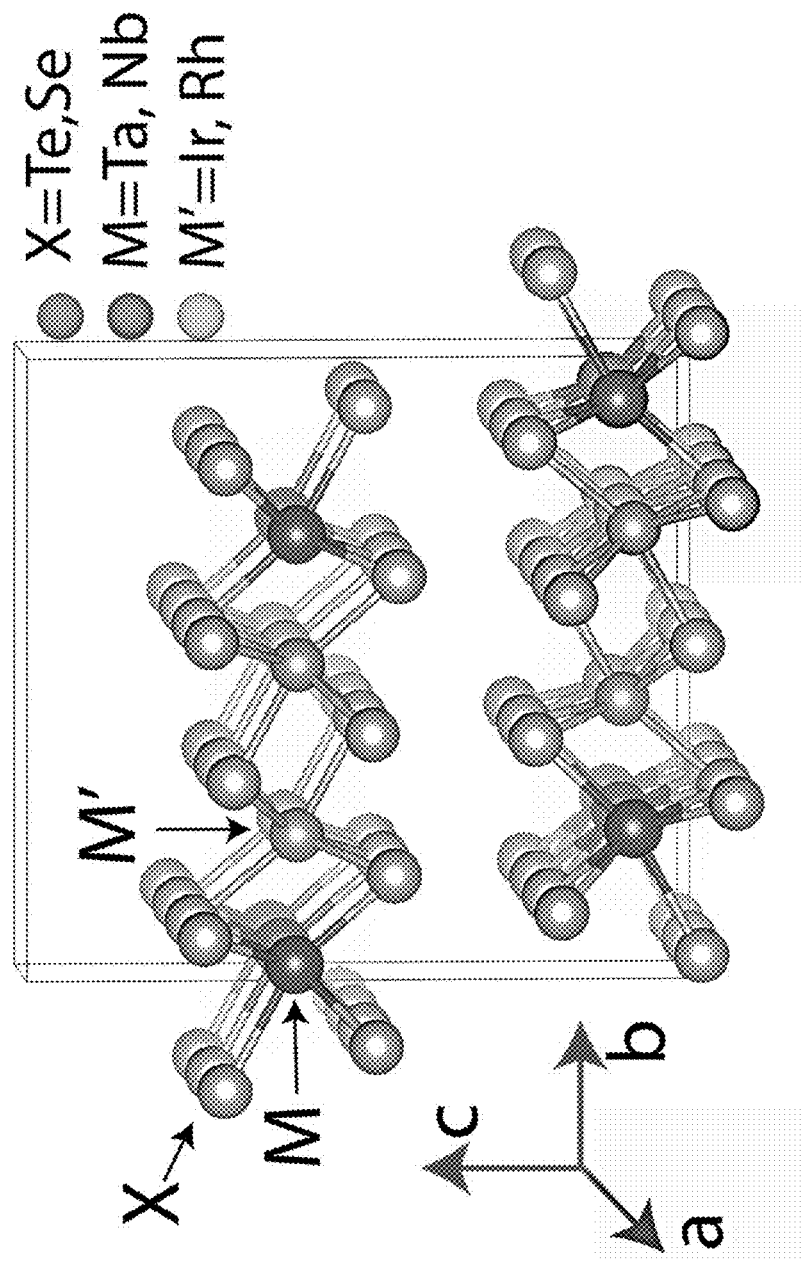
FIG. 2. The crystal structure of the $T_d$ phase in MM'X$_4$ semimetals.

The thin film of layered topological semimetal may be composed of any topological semimetal that is non-centrosymmetric, as required to give rise to the non-linear Hall effect. Suitable layered topological semimetals include type II Weyl semimetals. While binary type II Weyl semimetals, such as $MoTe_2$ or $WTe_2$, can be used, ternary type II Weyl semimetals having the $T_d$ structural phase $MM'X_4$, where M is Ta or Nb; M' is Ir or Rh; and X is Te or Se, are particularly useful due to their strong non-linear Hall effect at room temperature (~23° C.) and van der Waals nature. An example of one such ternary type II Weyl semimetal is $TaIrTe_4$. In the $T_d$ phase, $MM'X_4$ crystallizes in a non-centrosymmetric orthorhombic structure and its unit cell contains four formula units which form two layers of distorted corner sharing octahedra. The crystal structure of the $T_d$ phase $MM'X_4$ semimetals is shown in FIG. 2. This structural phase can be derived from the $WTe_2$ structure by doubling the b-axis and constructing the metal-metal chains by alternating M and M' atoms. The zigzag chains are ordered in an [M-M'-M'-M] fashion when the chains are linked to form an extended planar layer, hence the doubling of the b-axis. Additionally, the van der Walls stacking in the layered type II Weyl semimetals facilitates the thinning of the semimetals via exfoliation to produce thin films, which is desirable for reasons discussed in more detail below.

The film of layered topological semimetal 102 in the THz NHDs is thin because reducing the thickness of the layered topological semimetal increases the divergence of the Berry curvature, allows for effective electrostatic gate control of the THz response, and facilitates ultracompact information processing. Although the optimal thickness for the film of layered topological semimetal will depend on the intended application and the particular semimetal being used, the film of layered topological semimetal will typically have a thickness of 20 nanometers (nm) or lower, including thicknesses of 15 nm or lower, 10 nm or lower, and 6 nm or lower (e.g., thicknesses in the range from 1 nm to 10 nm), where the thickness direction is the direction normal to the plane of the film of layered topological semimetal. Thus, for the van der Waals-stacked layered topological semimetals, the film may comprise only a few layers (e.g., fewer than 10, fewer than 8, or fewer than 6 stacked layers) of the material.

Optionally, antenna 112 can be used to enhance a THz signal incident upon film of layered topological semimetal 102. The antenna, which may be a plasmonic antenna deposited directly on the layered topological semimetal, is designed to concentrate electric fields to enhance local THz EM fields and absorption and surface plasmon assisted nanoscale carrier transport to enhance the THz-to-DC conversion efficiency of the THz NHD. By way of illustration only, a gold plasmonic antenna designed to operate at THz wavelengths can be patterned onto the film of layered topological semimetal to amplify the THz photocurrent signal by one to two orders of magnitude. While antenna 112 in FIG. 1C is a bowtie-shaped antenna, other antenna designs can be used, including dipole antennas, plasmonic gratings, and plasmonic metasurfaces.

THz NHD Response Modulation with Electrostatic Gating.

The THz sensing response in the NHDs can be tuned using electrostatic gating. This design feature facilitates THz sensing optimization and THz electrical modulation. Because the strength of the non-linear Hall effect in a layered topological semimetal depends on its Fermi level, the ability to control the Fermi level enables a tunable and optimizable THz detector. In the THz NHDs described herein, this controllability can be provided by dynamic electrostatic doping of the thin film of layered topological semimetal using a single gate or dual gates to apply an out-of-plane electric field across the layered topological semiconductor and control ion implantation (electrostatic doping) in the layered topological semimetal. In a single gate design, the gate simultaneously applies the electric field and electrostatic doping. The single gate may be a top gate or a bottom gate. In a dual-gate design, a top gate and a bottom gate can be biased independently, allowing for the independent control and optimization the of the electric field and electrostatic doping. Thus, a dual gate design may provide better detector optimization. In either design, the gates are used to shift the Fermi level of a layered topological semimetal on-demand and to enhance the THz non-linear rectification responses, including broadband responsivity, sensitivity and/or response time. The injection of a high density of charge carriers (electrons or holes) into the layered topological semimetal is facilitated by the weak electrostatic screening in the ultrathin films of the layered topological semimetals. By way of illustration only, a charge carrier density of up to $1\times10^{13}$ cm$^{-2}$ (for example, from $1\times10^{12}$ cm$^{-2}$ to $1\times10^{13}$ cm$^{-2}$) or even higher can be achieved through electrostatic doping, which can improve the rectification response of the THz NHDs by an order of magnitude or more.

The embodiment of the NHD shown in FIG. 1C is an example of a detector with a single gate design. In this case, a voltage source is connected across terminal 106 and a bottom gate. The bottom gate is composed of a gate stack that includes a layer of electrically conductive material (a gate electrode) 114 and a layer of dielectric material (a gate dielectric) 104 disposed between the gate electrode and the thin film of layered topological semimetal 102.

Figure 1D:
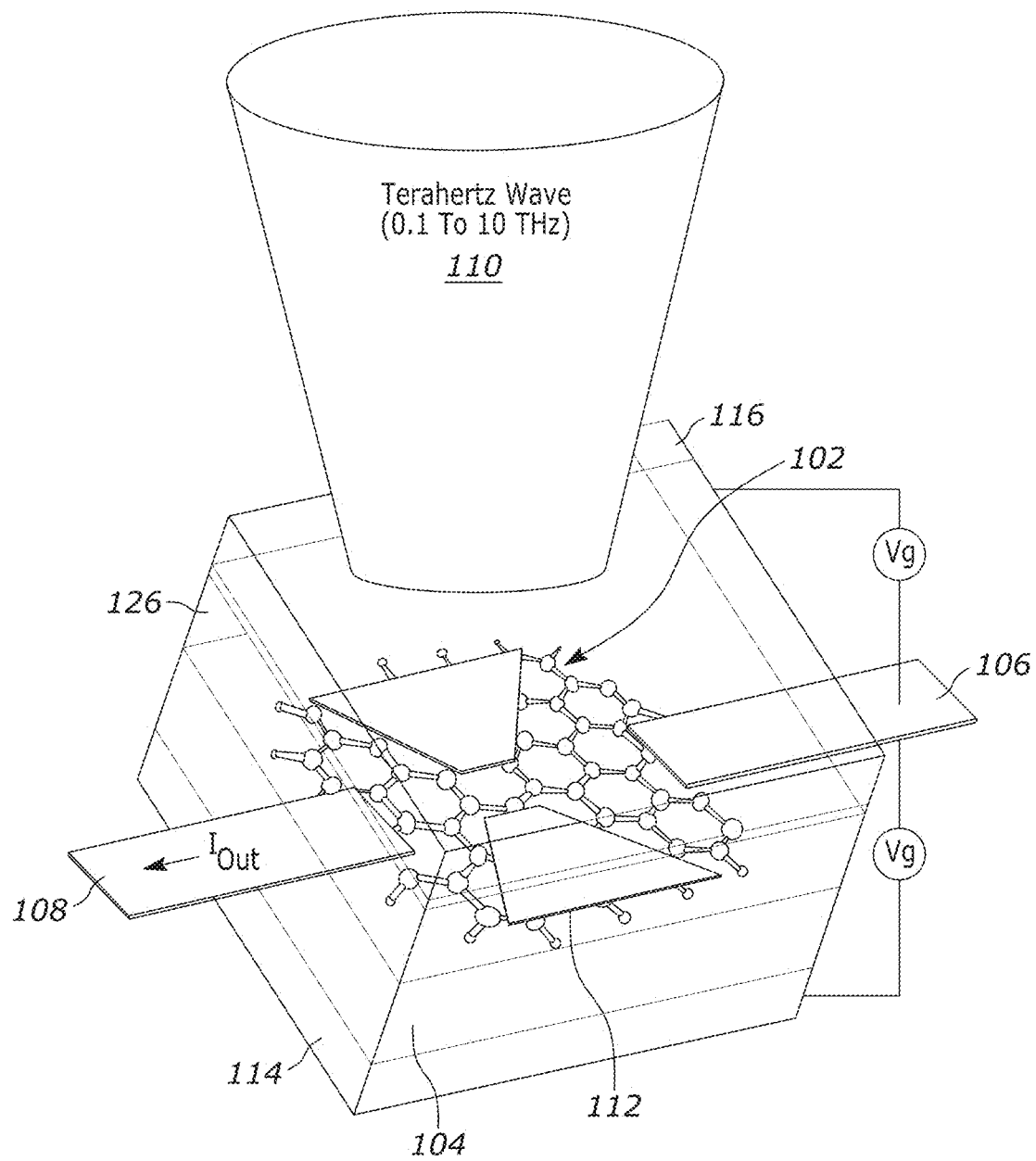
FIG. 1D. Schematic diagram of a THz non-linear Hall detector with a top gate and a bottom gate.

One embodiment of a THz detector with electrostatic gating using dual gates is shown in FIG. 1D. The gates can be separately biased and each gate is a gate stack that includes a layer of electrically conductive material (a gate electrode) 114, 116 and a layer of dielectric material (a gate dielectric) 104, 126 disposed between the gate electrode and the thin film of layered topological semimetal 102.

By way of illustration only, the gate stacks in the single- and dual-gated NHDs may include a layer of hexagonal boron nitride (h-BN) as a dielectric material and a layer of graphite as an electrically conductive material. However, other dielectrics and electrically conductive materials can be used. The layers of dielectric material of the top and bottom gates may cover the entire upper and lower surfaces of the film of layered topological semimetal, such that the film of layered topological semimetal is encapsulated by the dielectric materials, except where it connects with electrically conductive contacts 106 and 108 and, if present, an antenna formed on the layered topological semimetal. The encapsulation of the film of layered topological semimetal is advantageous because it protects the layered topological semimetal from surface degradation and damage during fabrication. The gate electrodes of the top and bottom gate stacks may be, but need not be, the same shape and size as their corresponding dielectric layers.

The biasing of the gates can be controlled using a biasing circuit that includes a voltage source connected to the gates and configured to apply a gate voltage. For the dual-gate design, the biasing circuit can be configured to apply the same gate voltage to both gates or to apply different gate voltages two the two gates. For example, a positive gate voltage, relative to a ground, may be applied to the electrically conductive layer of the top gate and a negative gate voltage, relative to a ground, may be applied to the electrically conductive layer of the bottom gate, or vice versa.

A current detector connected to electrically conductive contacts 106, 108 can be used to measure the DC rectification current across the terminals. The current detector may be a detector that measures the transverse DC rectification current directly or a detector that conducts a current to voltage rectification to provide a voltage readout.

Figure 3A:
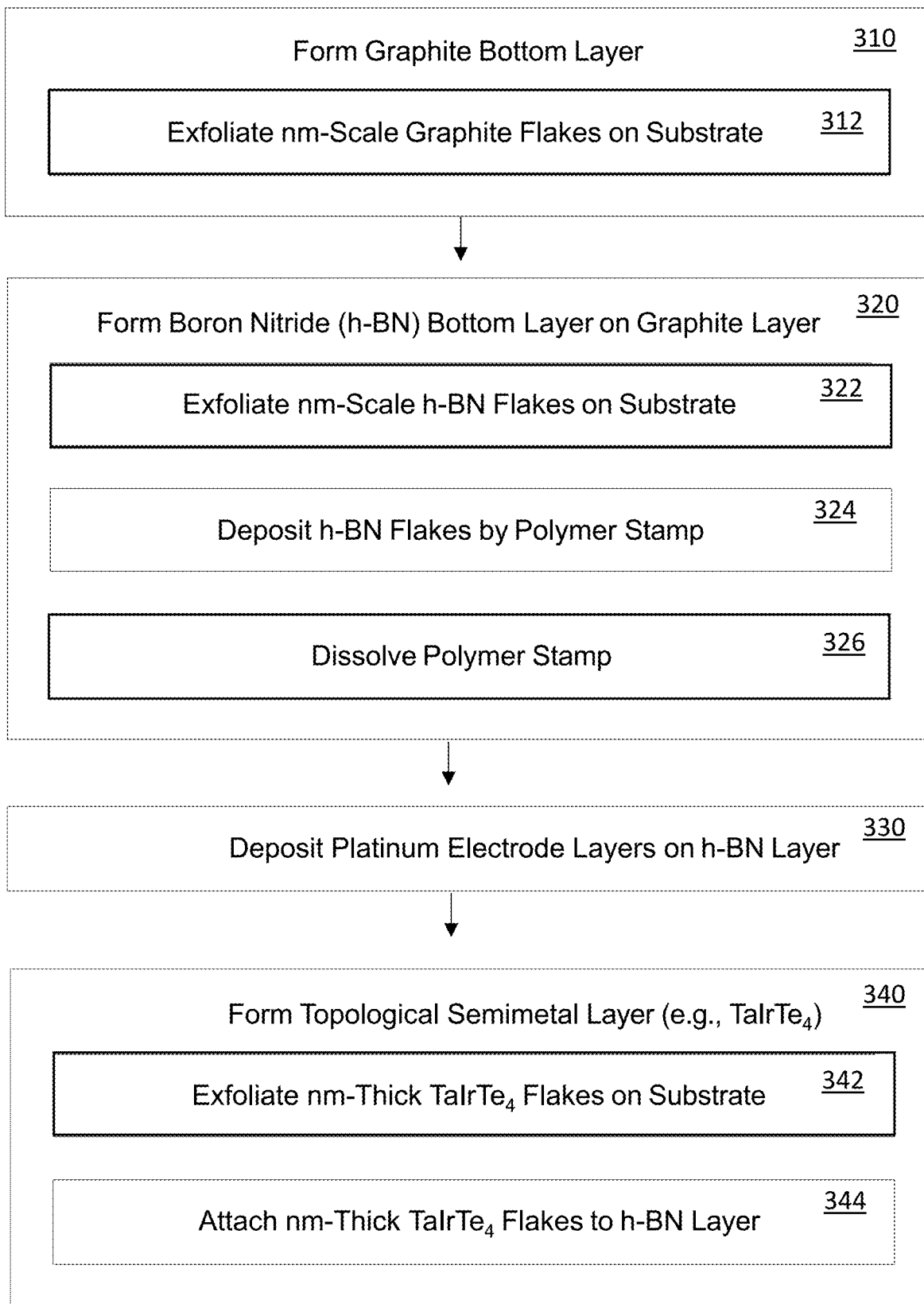

THz NHD Fabrication:

A flow chart illustrating one method of fabricating a dual-gated THz NHD of a type described herein is provided in FIGS. 3A and 3B. For illustrative purposes, TaIrTe$_4$, platinum, h-BN, and graphite are used for the layered topological semimetal, electrical terminal material, gate dielectrics, and gate electrodes, respectively. However, other layered topological semimetal, dielectrics, and electrically conductive materials can be used.

At step 310, the bottom gate electrode is deposited onto a support substrate, such as an SiO$_2$/Si substrate. For graphite, the deposition can be carried out via exfoliating nanometer-scale graphite flakes onto the substrate (step 312). For compact device fabrication, the gate electrodes can be very thin, having thicknesses in the range from, for example, 2 nm to 5 nm. Next, the bottom gate dielectric is formed on the bottom gate electrode (step 320) using, for example, a polymer stamp-based dry transfer process. If the gate dielectric is h-BN or a similar layered dielectric material, this can be accomplished by exfoliating a thin layer of h-BN flakes onto a temporary substrate (step 322), then picking up the exfoliated h-BN flakes on a polymer stamp and transferring them to the bottom graphite layer (step 324). The polymer stamp can then be removed (e.g., dissolved) (step 326).

Next, the terminals can be deposited onto the dielectric layer of the bottom gate (step 330). The terminals are composed of an electrically conductive material, such as a metal (e.g., gold or platinum) or metal alloy, and can be deposited using known processes, such as evaporation or sputtering. A thin film of layered topological semimetal is then deposited over the ends of the terminals and the bottom gate dielectric (step 340). This can be accomplished by exfoliating a thin film of layered topological semimetal onto a temporary substrate (step 342) and dry-transferring the film of layered topological semimetal onto the terminals and the bottom gate dielectric (step 344). Dry transfer can be carried out by contacting the exfoliated layered topological semimetal with the bottom gate dielectric (e.g., the bottom h-BN) of the pre-formed support substrate/gate electrode/gate dielectric/terminal stack.

The top gate can be formed separately and then transferred onto the thin film of the layered topological semimetal (step 350) of the bottom stack. The top gate can be fabricated in the same manner as the bottom gate, except that the top gate is initially formed on a temporary substrate with the order of the dielectric and electrode layers reversed. Thus, h-BN and graphite flakes can be exfoliated onto a temporary substrate (step 352). A polymer stamp is then used to pick up the top gate electrode (e.g., the exfoliated graphite) and then the top gate dielectric (e.g., the exfoliated h-BN). The assembled top gate can then be dry-transferred onto the layered topological semimetal (step 354) The polymer stamp can then be removed (e.g., dissolved) (step 356). Electrical bonding pads may then be formed on the terminals and on the top and bottom gate electrodes (step 360) using, for example, e-beam lithography and evaporation.

THz NHD Operation.

Figure 4:
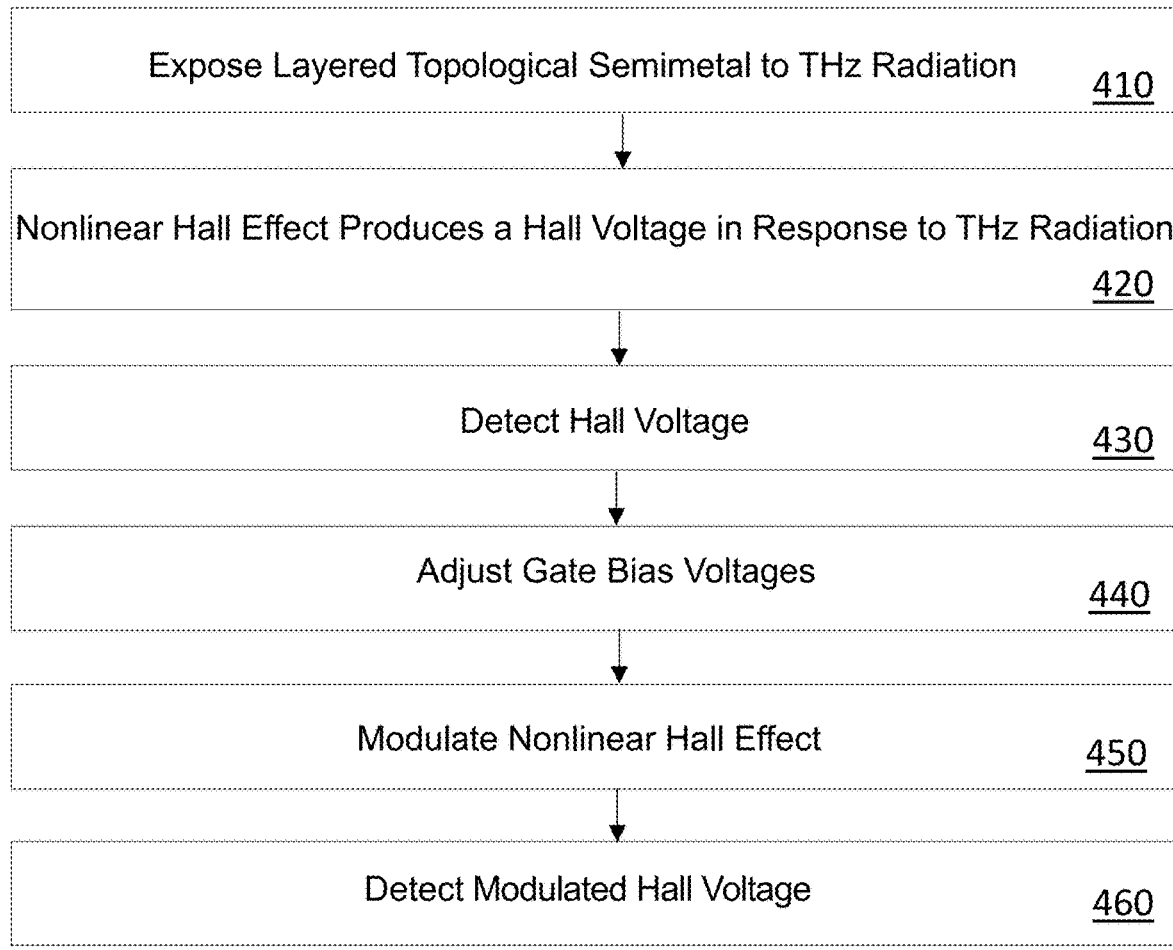
FIG. 4. Flow chart showing the operation of a THz non-linear Hall detector.

A flow chart illustrating the operation of a dual-gated THz NHD is provided in FIG. 4. When the film of layered topological semiconductor of the THz NHD is exposed to THz radiation (step 410), it results in the generation of a transverse direct current and a Hall voltage via the non-linear Hall effect (step 420), which can be detected (step 430). If the detector performance is poor with respect to responsivity and sensitivity, spectral bandwidth, and/or speed, the top and bottom gate biases can be independently adjusted (step 440) to modulate the non-linear Hall effect (step 450) in the layered topological semimetal and the resulting modulated Hall voltage can be detected (step 460). The steps of adjusting the gate bias and monitoring the Hall voltage can be repeated until the performance of the THz detector is optimized.

THz Detector Device Performance:

Using the THz NHD design described herein, THz NHDs having improved performance over existing THz detectors can be realized. Table 1 in FIG. 5 shows operating performance ranges that can be achieved by THz NHDs of the type described herein in comparison with the device performance ranges of known THz detectors. It should be understood, however, that the THz NHDs described herein need not achieve the performance characteristics in Table 1, as lower performance standards may be suitable for various intended applications. The data shown in FIG. 5 for the bolometer/Golay, HEMT, and Schottky diode detectors is from the following publications: Lewis, R. A. *Journal of Physics D: Applied Physics* vol. 52; Valugis, G. et al., *Sensors* vol. 21 (2021); and Yachmenev, A. E. et al., *J Phys D Appl Phys* 55, 193001 (2022).

EXAMPLE

This Example describes a method for fabricating an NHD based on a $TaIrTe_4$ single-crystal and presents data demonstrating the THz rectification capabilities of the NHD.

THz NHD Fabrication.

A tunable, dual-gated non-linear Hall THz detector was fabricated as follows. First, graphite and h-BN crystals were mechanically exfoliated onto 280 nm-thick $SiO_2$/Si substrates. Graphite flakes with thicknesses in the range from 2-5 nm were chosen as the electrode materials for the top and bottom gates and 10-30-nm-thick h-BN flakes were chosen for the top and bottom gate dielectrics. The top and bottom gates were prepared separately using a polymer-based dry transfer technique. For the bottom gate, an h-BN flake was picked up on a polymer stamp and placed onto the bottom graphite.

After dissolving the polymer, fine metal terminals (~5 nm) were patterned on the h-BN surface. The metal terminals were patterned as follows. A uniform layer of photoresist was applied to the surface by spin coating. Following a soft baking step, most of the solvent was removed from the photoresist. Then, the photoresist was exposed to a pattern of intense light and developed. A post-exposure bake (PEB) was conducted before developing to help reduce standing wave phenomena caused by the destructive and constructive interference patterns of the incident light Electron-beam evaporation was used to deposit a thin (~7 nm-thick) gold film of the terminals. Following a lift off process, the photoresist was removed, leaving the patterned gold forming the terminals.

For the top gate, graphite flakes were picked up by another polymer strap first, then the top h-BN were picked up. The top and bottom gate stacks were then transferred to an oxygen- and water-free glovebox.

$TaIrTe_4$ single-crystals were exfoliated inside the glovebox, and $TaIrTe_4$ flakes (ultrathin $T_d$-stacking layers) with suitable thickness were identified by optical contrast. Such flakes were picked up by the top gate; the full detector stack was then completed by transferring the top stack (graphite/BN/$TaIrTe_4$) onto the contacts/h-BN/graphite bottom stack before removing the resulting device from the glovebox. Finally, after dissolving the polymer, another step of e-beam lithography and evaporation was used to define electrical bonding pads (Cr/Au) connecting to the metal terminals and the top and bottom gate electrodes. The number of $TaIrTe_4$ sheets and thickness of h-BN layers were confirmed by Raman spectroscopy and atomic force microscopy (AFM). All devices were protected by encapsulation. Specifically, the entire device was covered by a large top layer of h-BN via in-house transfer or by a layer aluminum oxide (~30 nm-thick) deposited via atomic layer deposition (ALD).

Non-Linear Hell Transport of $TaIrTe_4$ Thin Films.

Figure 6:
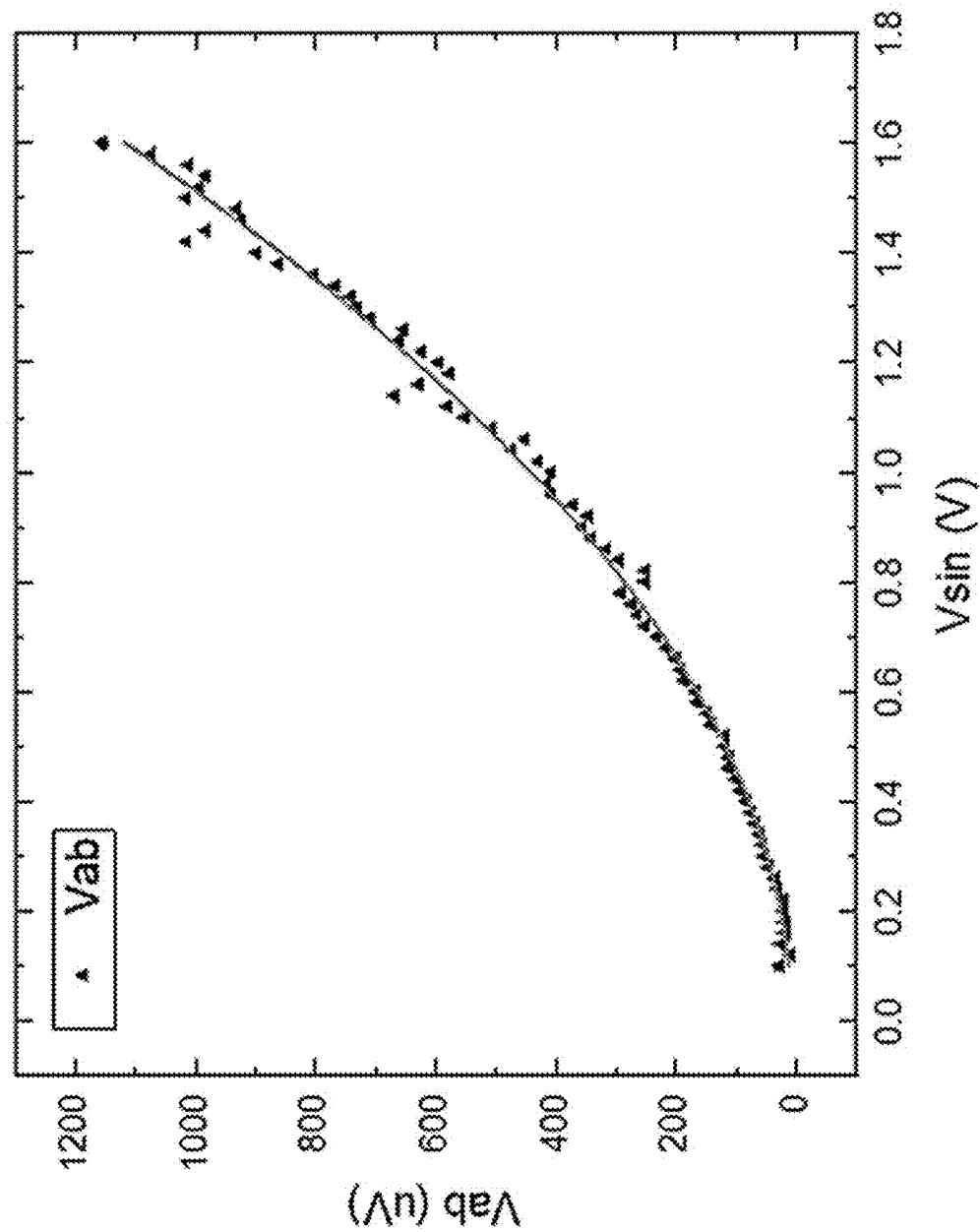
FIG. 6. Non-linear Hall measurement for a 3 nm-thick TaIrTe$_4$ film showing a large non-linear conductivity $\chi_{abc}$.

Non-linear Hall transport measurements were taken using a 3 nm-thick $TaIrTe_4$ film to directly probe its non-linear conductivity. A large non-linear conductivity was measured, as shown in FIG. 6.

Carrier Lifetime and Broadband Response in $TaIrTe_4$ Thin Films.

Figure 7A:
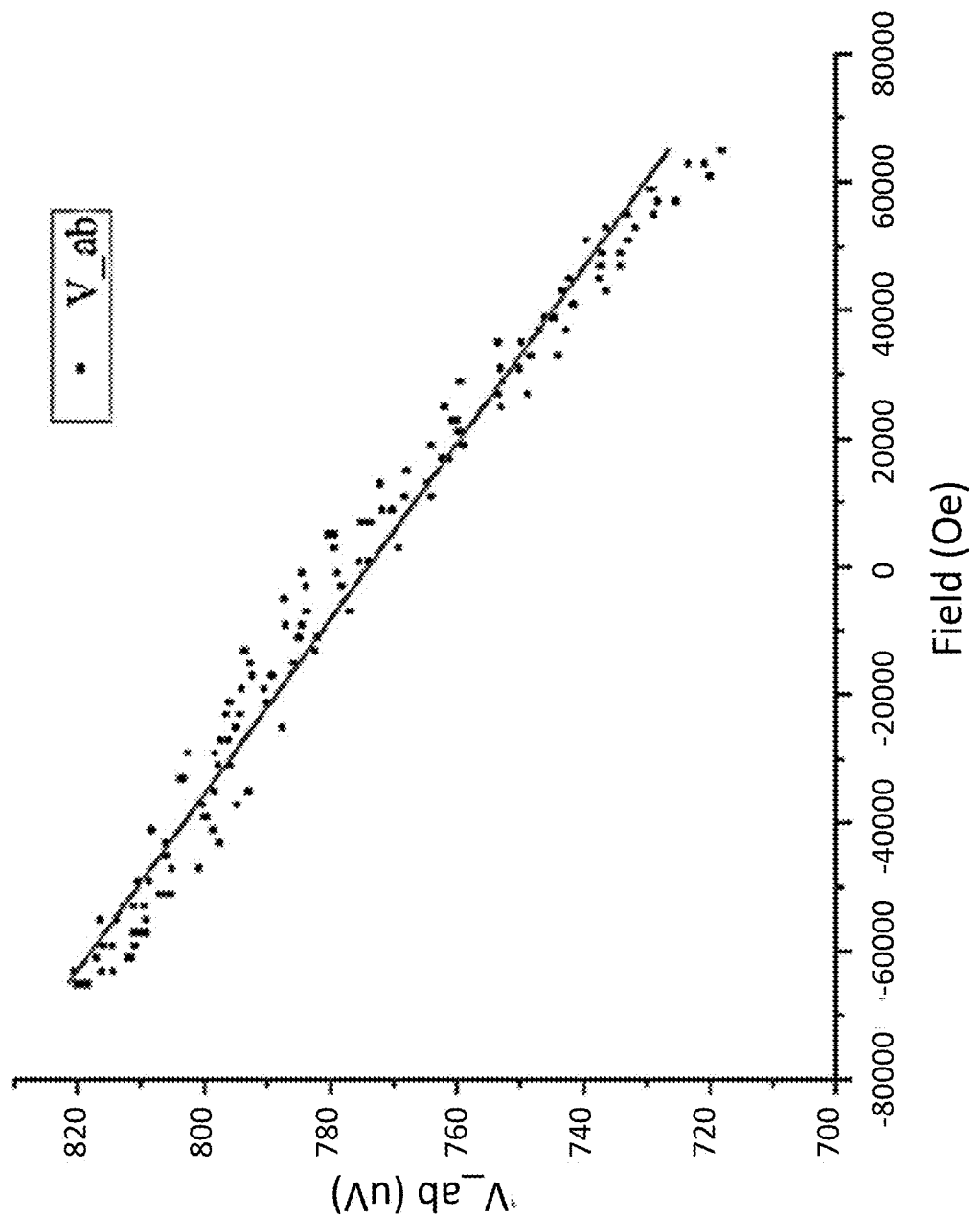
FIGS. 7A and 7B. Hall effect measurements of an 8 nm-thick TaIrTe$_4$ film for use in carrier concentration (n) determination (FIG. 7A); and simulated non-linear Hall effect cut-off frequency curves for different carrier lifetimes (FIG. 7B).

Carrier lifetime measurements were taken using an 8 nm-thick $TaIrTe_4$ film. Carrier lifetime (or electrical conductivity) affects the magnitude of the non-linear Hall current generation. The carrier lifetime was estimated based on the Drude model and the experimental transport measurements in the following way: the DC-limit conductivity $$\sigma = \frac{ne^2\tau}{m^*},$$

according to the Drude model, where $\tau$ is the carrier lifetime, n is the carrier concentration, e is electron charge, and $m^*$ is effective mass. The conductivity $\sigma$ was extracted from standard four-probe terminal conductance measurements on a series of ternary layered semimetal samples with different thicknesses, but identical device geometry. Using the same transport test platform with −7 T to 7 T magnetic field (B) capability, the carrier concentration n was determined by the Hall effect as follows. The Hall resistance curve was linearly fitted and the carrier density was derived from $$n = \frac{1}{R_H e}, R_H = \frac{R_{xy}(B) - R_{xy}(0)}{B},$$

where $R_{xy}(B)$ is the transverse resistance under the field B, and $R_{xy}(0)$ is the transverse resistance without field B. The preliminary Hall effect results for the 8 nm $TaIrTe_4$ film revealed a carrier lifetime of approximately 10 fs (FIG. 7A).

Figure 7B:
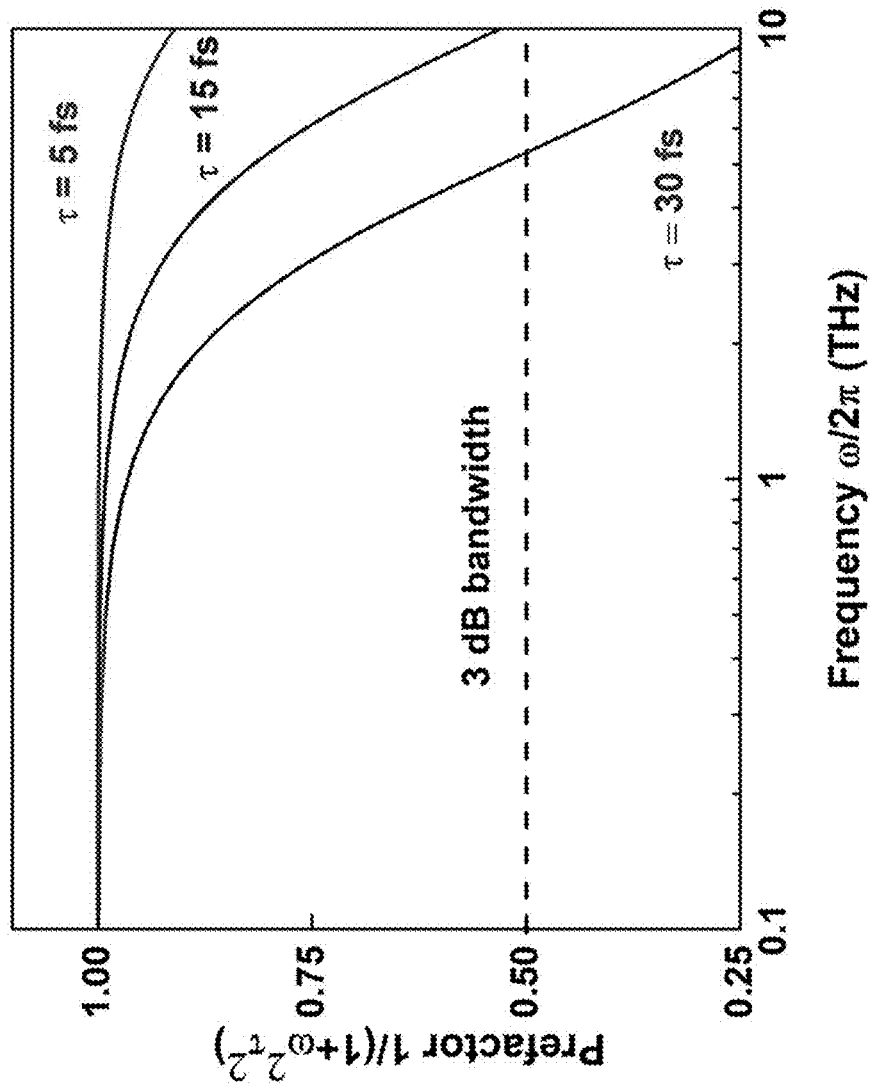

Cut-off frequency curves based on different carrier lifetimes were then simulated based on the theory of non-linear Hall transport, whereby the current rectification response is the product of a prefactor $1/(1+\omega^2\tau^2)$, non-linear conductivity tensor $\chi_{abc}$, and the AC electric field $$\left(J_a(\omega=0) = \left(\frac{1}{1+\omega^2\tau^2}\right)\chi_{abc}E_b(\omega)E_c(-\omega)\right),$$

where $\omega$ is the AC angular frequency. The cut-off curves, shown in FIG. 7B, show that a broadband spectral response covering the entire THz regime (0.1-10 THz) can be achieved (FIG. 7B).

THz Responsivity in $TaIrTe_4$ Thin Films.

Figure 8B:
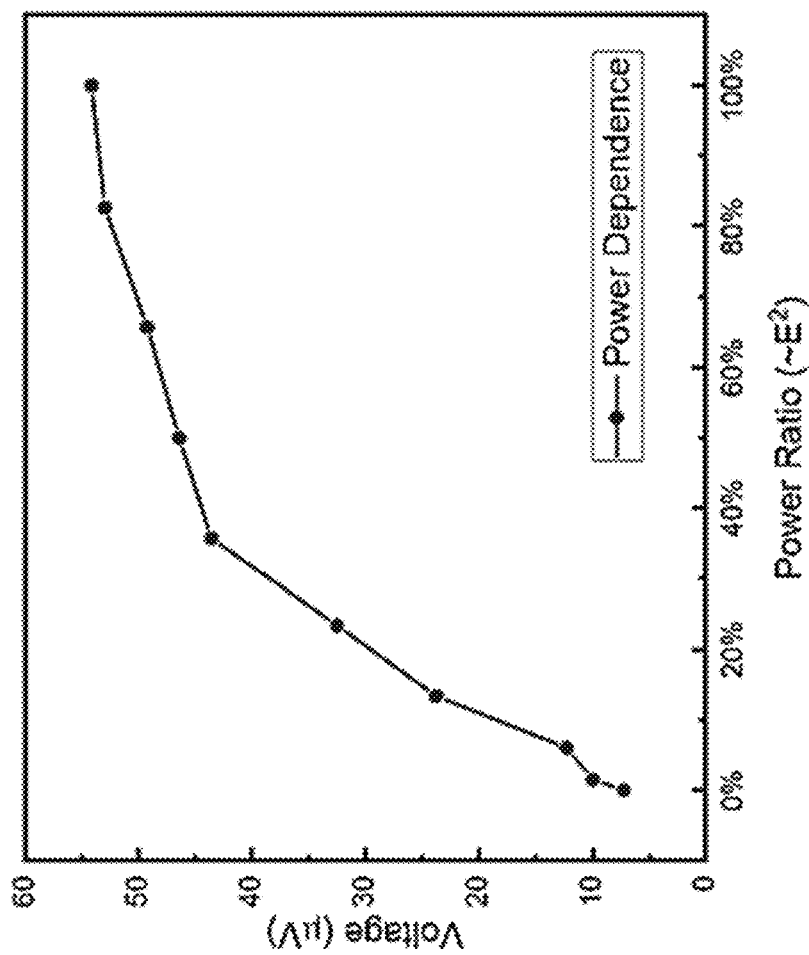
FIGS. 8A and 8B. THz rectification characterization set-up for responsivity measurements (FIG. 8A) and results of THz responsivity measurement using a few-layer thick TaIrTe$_4$ film (FIG. 8B).
Figure 8A:
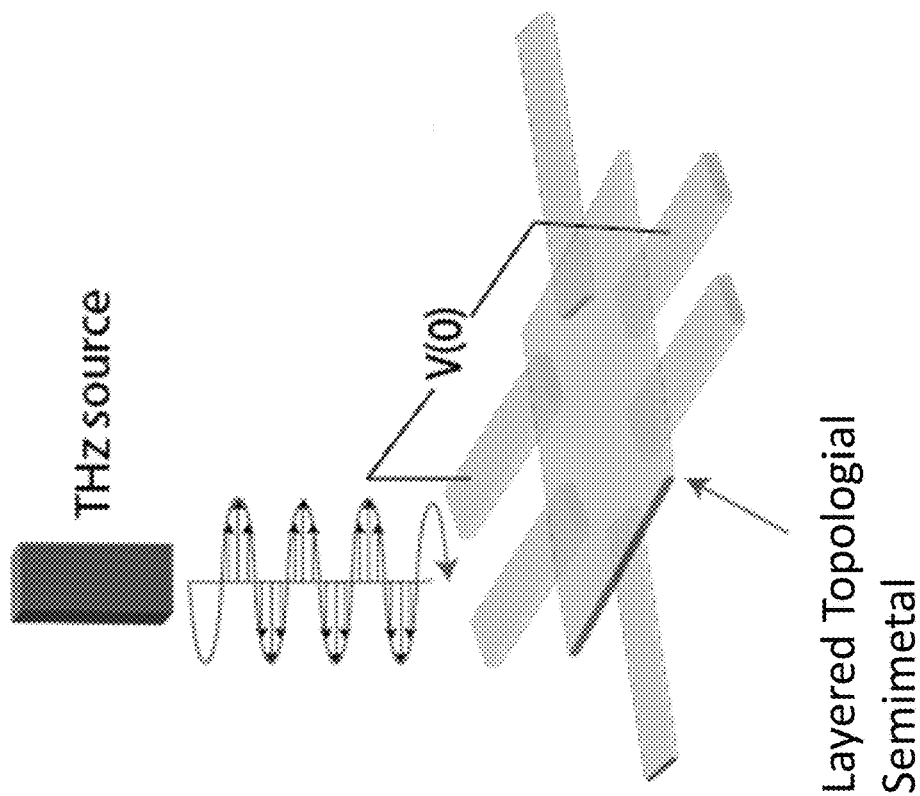

THz responsivity measurements were taken using a few-sheet-thick $TaIrTe_4$ film. An CW IMPATT diode was used as the THz excitation sources (0.1 THz), and the incident THz radiation was free-space radiation guided and modulated by an optical chopper. The photocurrent generated by the non-linear Hall effect in the TaIrTe$_4$ was measured using a phase-sensitive lock-in scheme. As shown in FIG. 8A, the photocurrent flow was measured through different terminals in Hall shape geometry. The THz responsivity measurements are shown in FIG. 8B.

Antenna Design.

Figure 9B:
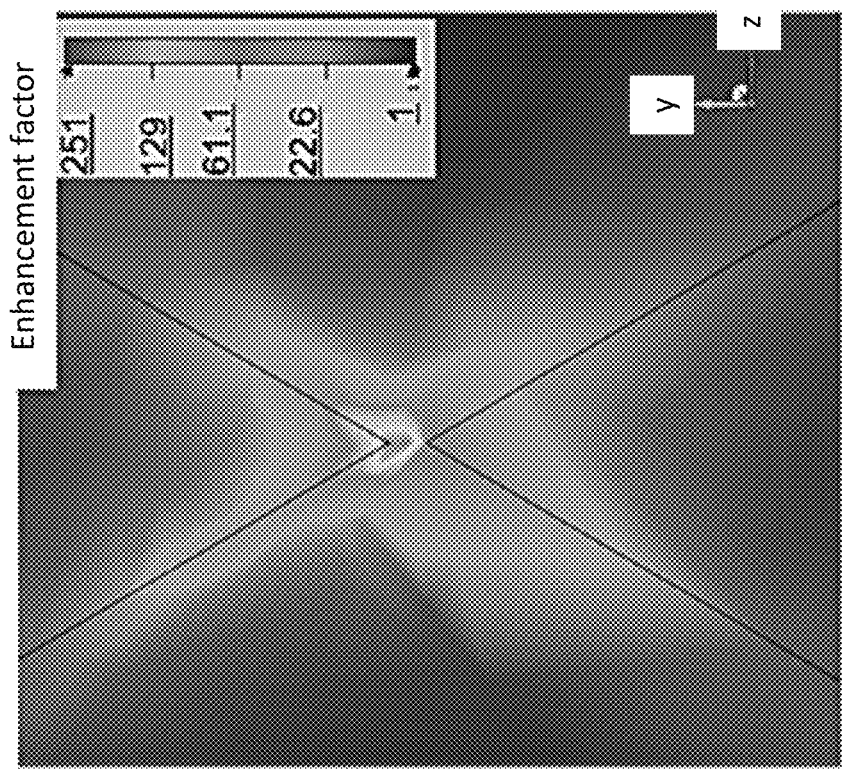
FIGS. 9A and 9B. Bowtie antenna (FIG. 9A) for a bowtie-shaped electrical field enhancement pattern (FIG. 9B).
Figure 9A:
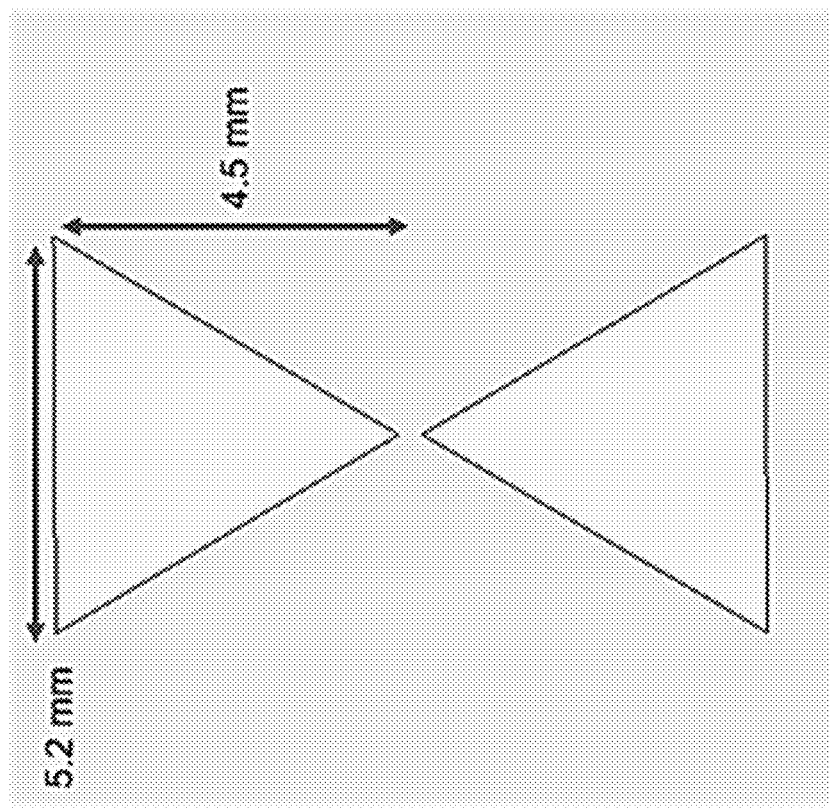

Plasmonic contact electrodes were designed with a bowtie antenna pattern (FIG. 9A) to enhance the local THz EM fields/absorption, as well as surface plasmon assisted nanoscale carrier transport to improve the THz-to-DC conversion efficiency. The design was investigated by a 3D, full-wave electromagnetic simulation using numerical analysis software from CST studio (Dassault Systems) and COMSOL Multiphysics. The simulation results (FIG. 9B) showed an enhancement over 100× in the gap region between the electrodes when the detector was illuminated by a plane wave source at 0.1 THz.

The word "illustrative" is used herein to mean serving as an example, instance, or illustration. Any aspect or design described herein as "illustrative" is not necessarily to be construed as preferred or advantageous over other aspects or designs.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

If not already included, all numeric values of parameters in the present disclosure are proceeded by the term "about" which means approximately. This encompasses those variations inherent to the measurement of the relevant parameter as understood by those of ordinary skill in the art. This also encompasses the exact value of the disclosed numeric value and values that round to the disclosed numeric value.

What is claimed is:

1. A terahertz radiation detector comprising:
   a film of layered topological semimetal having non-centrosymmetric crystal symmetry;
   a first electrically conductive terminal in contact with the film of layered topological semimetal;
   a second electrically conductive terminal in contact with the film of layered topological semimetal;
   at least one gate on a bottom surface or on a top surface of the layered topological semimetal, the at least one gate comprising a gate dielectric in contact with the layered topological semimetal and a gate electrode on the gate dielectric;
   a voltage source connected to the gate and configured to apply a gate voltage to the film of layered topological semimetal; and
   a current detector connected to the first and second electrically conductive terminals and configured to measure a transverse direct current through the film of layered topological semimetal.

2. The terahertz radiation detector of claim 1, wherein the film of layered topological semimetal comprises a type II Weyl semimetal.

3. The terahertz radiation detector of claim 2, wherein the layered topological semimetal is a ternary T$_d$ phase MM'X$_4$ semimetal, where M is Ta or Nb; M' is Ir or Rh; and X is Te or Se.

4. The terahertz radiation detector of claim 3, wherein the ternary T$_d$ phase MM'X$_4$ semimetal is TaIrTe$_4$.

5. The terahertz radiation detector of claim 1, wherein the film of layered topological semimetal has a thickness of 10 nm or less.

6. The terahertz radiation detector of claim 1, comprising:
   the at least one gate on a bottom surface of the layered topological semimetal; and
   a top gate on a top surface of the layered topological semimetal, the top gate comprising a top gate dielectric in contact with the layered topological semimetal and a top gate electrode on the top gate dielectric.

7. The terahertz radiation detector of claim 6, wherein the at least one voltage source is configured to bias the top and bottom gates independently.

8. The terahertz radiation detector of claim 1, further comprising an antenna on the film of layered topological semimetal, wherein the antenna is configured to enhance a THz signal incident upon the film of layered topological semimetal.

9. A method for detecting terahertz radiation using a terahertz detector comprising:
   a film of layered topological semimetal having non-centrosymmetric crystal symmetry;
   a first electrically conductive terminal in contact with the film of layered topological semimetal;
   a second electrically conductive terminal in contact with the film of layered topological semimetal;
   at least one gate on a bottom surface or on a top surface of the layered topological semimetal, the at least one gate comprising a gate dielectric in contact with the layered topological semimetal and a gate electrode on the gate dielectric;
   a voltage source connected to the gate and configured to apply a gate voltage to the film of layered topological semimetal; and
   a current detector connected to the first and second electrically conductive terminals and configured to measure a transverse direct current through the film of layered topological semimetal,
   the method comprising:
   exposing the film of topological semimetal to terahertz radiation, whereby the terahertz radiation produces a transverse direct current in the film of topological semimetal via the non-linear Hall effect; and
   measuring the transverse direct current using the current detector.

10. The method of claim 9, further comprising applying a gate bias voltage to the at least one gate to modulate the transverse direct current.

11. The method of claim 10, wherein the transverse direct current is measured at a temperature in the range from 20° C. to 25° C.

12. The method of claim 10, wherein the terahertz radiation detector has a responsivity of greater than 1×10$^3$ V/W.

13. The method of claim 10, wherein the terahertz radiation detector has a spectral bandwidth from 0.1 THz to 10 THz.

14. The method of claim 9, wherein the at least one gate is on a bottom surface of the layered topological semimetal and the terahertz radiation detector further comprises:
   a top gate on a top surface of the film of layered topological semimetal, the top gate comprising a top gate dielectric in contact with the film of layered topological semimetal and a top gate electrode on the top gate dielectric, the method further comprising: independently biasing the top gate and the bottom gate to modulate the transverse direct current.

15. The method of claim 14, wherein the film of layered topological semimetal comprises a type II Weyl semimetal.

16. The method of claim 15, wherein the layered topological semimetal is a ternary $T_d$ phase MM'X$_4$ semimetal, where M is Ta or Nb; M' is Ir or Rh; and X is Te or Se.

17. The method of claim 16, wherein the ternary $T_d$ phase MM'X$_4$ semimetal is TaIrTe$_4$.

18. The method of claim 9, wherein the film of layered topological semimetal comprises a type II Weyl semimetal.

19. The method of claim 18, wherein the layered topological semimetal is a ternary $T_d$ phase MM'X$_4$ semimetal, where M is Ta or Nb; M' is Ir or Rh; and X is Te or Se.

20. The method of claim 19, wherein the ternary $T_d$ phase MM'X$_4$ semimetal is TaIrTe$_4$.

* * * * *